United States Patent
Kolden et al.

(10) Patent No.: US 9,172,115 B2
(45) Date of Patent: Oct. 27, 2015

(54) BATTERY PACK WITH MULTIPLE WATER DISCHARGE PATHWAYS

(71) Applicant: Milwaukee Electric Tool Corporation, Brookfield, WI (US)

(72) Inventors: Michael Kolden, Wauwatosa, WI (US); Samuel Sheeks, Germantown, WI (US)

(73) Assignee: Milwaukee Electric Tool Corporation, Brookfield, WI (US)

( * ) Notice: Subject to any disclaimer, the term of this patent is extended or adjusted under 35 U.S.C. 154(b) by 106 days.

(21) Appl. No.: 13/915,621

(22) Filed: Jun. 11, 2013

(65) Prior Publication Data

US 2013/0330576 A1    Dec. 12, 2013

Related U.S. Application Data

(60) Provisional application No. 61/658,610, filed on Jun. 12, 2012, provisional application No. 61/710,390, filed on Oct. 5, 2012.

(51) Int. Cl.
*H01M 10/42* (2006.01)
*H01M 2/10* (2006.01)
(Continued)

(52) U.S. Cl.
CPC ............ *H01M 10/425* (2013.01); *H01M 2/105* (2013.01); *H01M 2/1055* (2013.01); *H01M 2220/30* (2013.01); *H05K 5/0221* (2013.01); *H05K 5/0239* (2013.01); *H05K 5/03* (2013.01)

(58) Field of Classification Search
CPC .......... H01M 2220/30; H01M 2/1022; H01M 2/105; H01M 2/1055; H01M 10/425; H05K 5/0221; H05K 5/0239; H05K 5/03

USPC ................................ 429/7, 121; 361/728, 810
See application file for complete search history.

(56) References Cited

U.S. PATENT DOCUMENTS

| | | |
|---|---|---|
| 5,401,591 A | 3/1995 | Bishay et al. |
| 5,585,710 A | 12/1996 | Nakamura et al. |
| 5,718,014 A | 2/1998 | deBlois et al. |

(Continued)

FOREIGN PATENT DOCUMENTS

| | | |
|---|---|---|
| KR | 20-1997-0002224 | 3/1997 |
| KR | 20-1997-0002226 | 3/1997 |

OTHER PUBLICATIONS

International Search Report and Written Opinion for Application No. PCT/US2013/045281 dated Feb. 20, 2014 (11 pages).

*Primary Examiner* — Milton I Cano
*Assistant Examiner* — Michael Dignan
(74) *Attorney, Agent, or Firm* — Michael Best & Friedrich LLP

(57) ABSTRACT

The present invention relates to a battery pack including a housing, a latch mechanism, a printed circuit board connected to electrical terminals, and an internal frame. The housing includes a first and second portion. The first portion includes openings that receive the latch mechanism and openings that receive the terminals. The battery pack also includes a latch cover that protects against water infiltrating between the openings and the latch mechanism, and a terminal cover that protects against water infiltrating between the first housing portion and the terminals. Water that enters the battery pack is directed to the bottom of the battery pack. The water is then drained through openings in the lower housing portion. The internal frame includes openings that secure batteries within the lower housing portion with the help of wedges that are positioned in between adjacent rows of batteries.

19 Claims, 15 Drawing Sheets

(51) Int. Cl.
*H05K 5/03* (2006.01)
*H05K 5/02* (2006.01)

(56) References Cited

U.S. PATENT DOCUMENTS

| | | |
|---|---|---|
| 5,738,177 A | 4/1998 | Schell et al. |
| 6,093,900 A | 7/2000 | Wisskirchen et al. |
| 6,271,644 B1 | 8/2001 | Okada et al. |
| 6,284,644 B1 | 9/2001 | Aug et al. |
| 6,537,694 B1 | 3/2003 | Sugiura et al. |
| 6,566,005 B1 | 5/2003 | Shimma et al. |
| 6,568,483 B2 | 5/2003 | McCallops et al. |
| 6,677,728 B2 | 1/2004 | Takedomi et al. |
| 6,722,549 B2 | 4/2004 | Shkolnikov et al. |
| 6,733,919 B1 | 5/2004 | Nguyen et al. |
| 6,783,886 B1 | 8/2004 | Sakakibara et al. |
| 6,805,207 B2 | 10/2004 | Hagan et al. |
| 6,811,922 B2 | 11/2004 | Madjar et al. |
| 6,957,706 B2 | 10/2005 | Burger et al. |
| 7,038,343 B2 | 5/2006 | Agnes et al. |
| 7,080,696 B2 | 7/2006 | Soika et al. |
| 7,121,445 B2 | 10/2006 | Hollis |
| 7,152,695 B2 | 12/2006 | Happ et al. |
| 7,211,347 B2 | 5/2007 | Sugiura et |
| 7,413,030 B2 | 8/2008 | Chen et al. |
| 7,414,337 B2 | 8/2008 | Wilkinson et al. |
| 7,470,485 B2 | 12/2008 | Kang et al. |
| 7,552,780 B2 | 6/2009 | Glauning et al. |
| 7,557,535 B2 | 7/2009 | Johnson et al. |
| 7,566,953 B2 | 7/2009 | Boulin et al. |
| 7,567,058 B2 | 7/2009 | Shimizu et al. |
| 7,572,547 B2 | 8/2009 | Sakakibara |
| 7,589,500 B2 * | 9/2009 | Johnson et al. ............... 320/134 |
| 7,597,199 B1 | 10/2009 | Rochelo |
| 7,597,993 B2 | 10/2009 | Glauning et al. |
| 7,618,741 B2 | 11/2009 | Casalena et al. |
| 7,638,234 B2 | 12/2009 | Naito et al. |
| 7,714,538 B2 | 5/2010 | Johnson et al. |
| 7,775,810 B2 | 8/2010 | Lawrence et al. |
| 7,824,799 B2 | 11/2010 | Takeshita et al. |
| 7,828,185 B2 | 11/2010 | Hofmann et al. |
| 7,845,427 B2 | 12/2010 | Wan et al. |
| 7,846,577 B2 | 12/2010 | Kozu et al. |
| 7,879,483 B2 | 2/2011 | Sakakibara |
| 7,968,222 B2 | 6/2011 | Kang et al. |
| 7,993,772 B2 | 8/2011 | Sakakibara |
| 8,006,778 B2 | 8/2011 | Wiker et al. |
| 8,051,922 B2 | 11/2011 | Ohlendorf et al. |
| 8,080,332 B2 | 12/2011 | Naito |
| 8,097,354 B2 | 1/2012 | Sakakibara |
| 8,114,537 B2 | 2/2012 | Kang et al. |
| 8,148,000 B2 | 4/2012 | Furuta et al. |
| 8,198,835 B2 | 6/2012 | Yokoyama et al. |
| 8,210,276 B2 | 7/2012 | Krondorfer et al. |
| 8,278,877 B2 | 10/2012 | Murayama et al. |
| 8,381,829 B2 | 2/2013 | Hanawa et al. |
| 8,410,756 B2 | 4/2013 | Sakakibara et al. |
| 2001/0046624 A1 | 11/2001 | Goto et al. |
| 2003/0172498 A1 | 9/2003 | Polzin et al. |
| 2004/0139835 A1 | 7/2004 | Wright et al. |
| 2005/0022358 A1 | 2/2005 | Hagan et al. |
| 2005/0042502 A1 | 2/2005 | Becker |
| 2005/0058890 A1 | 3/2005 | Brazell et al. |
| 2007/0173090 A1 | 7/2007 | Johnson et al. |
| 2008/0190631 A1 | 8/2008 | Lemmel et al. |
| 2008/0241675 A1 | 10/2008 | Enari et al. |
| 2009/0071675 A1 | 3/2009 | Hanawa et al. |
| 2009/0253030 A1 | 10/2009 | Kooij |
| 2009/0258584 A1 | 10/2009 | Huber et al. |
| 2010/0047682 A1 | 2/2010 | Houchin-Miller et al. |
| 2010/0092849 A1 | 4/2010 | Wood et al. |
| 2010/0156350 A1 | 6/2010 | Murayama et al. |
| 2010/0248004 A1 | 9/2010 | Takeshita et al. |
| 2010/0320969 A1 | 12/2010 | Sakakibara et al. |
| 2011/0013368 A1 * | 1/2011 | Nagaike ..................... 361/728 |
| 2011/0123851 A1 | 5/2011 | Byun |
| 2011/0212356 A1 | 9/2011 | Tennessen et al. |
| 2011/0220381 A1 | 9/2011 | Friese et al. |
| 2011/0308831 A1 | 12/2011 | Martinsson et al. |
| 2012/0015235 A1 | 1/2012 | Fuhr et al. |
| 2012/0045667 A1 * | 2/2012 | Yoneda et al. .................... 429/7 |
| 2012/0067608 A1 | 3/2012 | Heinzelmann et al. |
| 2012/0114998 A1 | 5/2012 | Hwang |
| 2012/0121938 A1 | 5/2012 | Kwag et al. |
| 2012/0121944 A1 | 5/2012 | Yamamoto et al. |
| 2012/0171539 A1 | 7/2012 | Rejman et al. |
| 2013/0098646 A1 * | 4/2013 | Funabashi et al. ................ 173/2 |
| 2013/0224539 A1 * | 8/2013 | Hayashi et al. .................. 429/82 |
| 2013/0280573 A1 * | 10/2013 | Taga ............................. 429/100 |

* cited by examiner

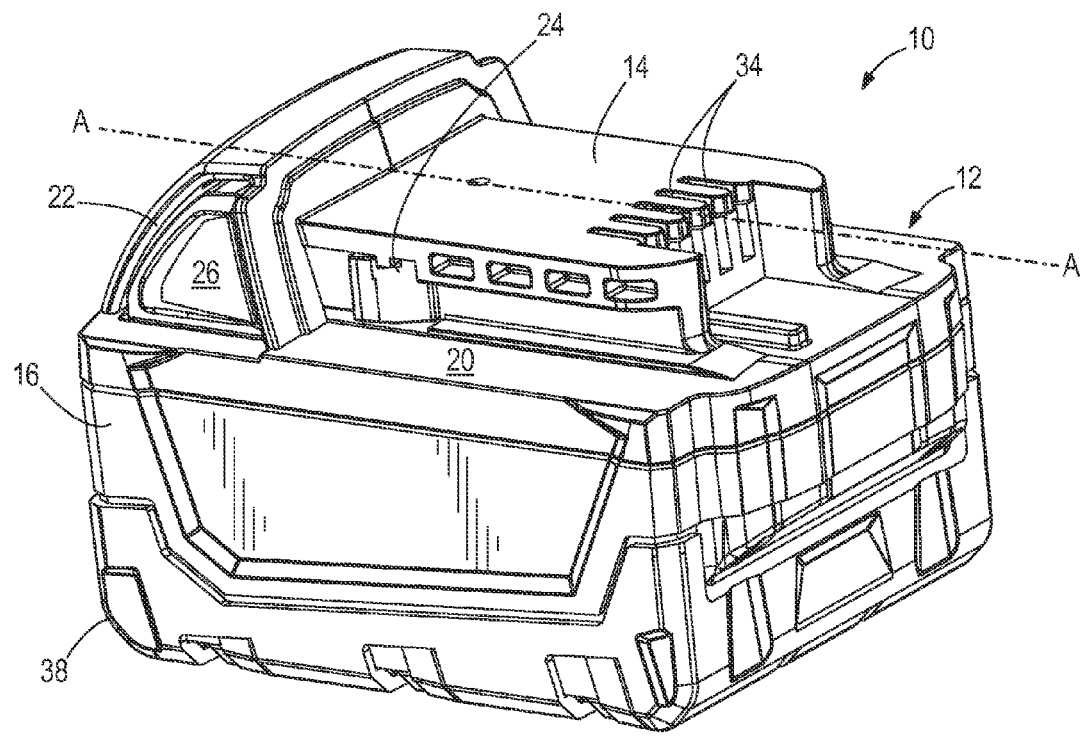
FIG. 1
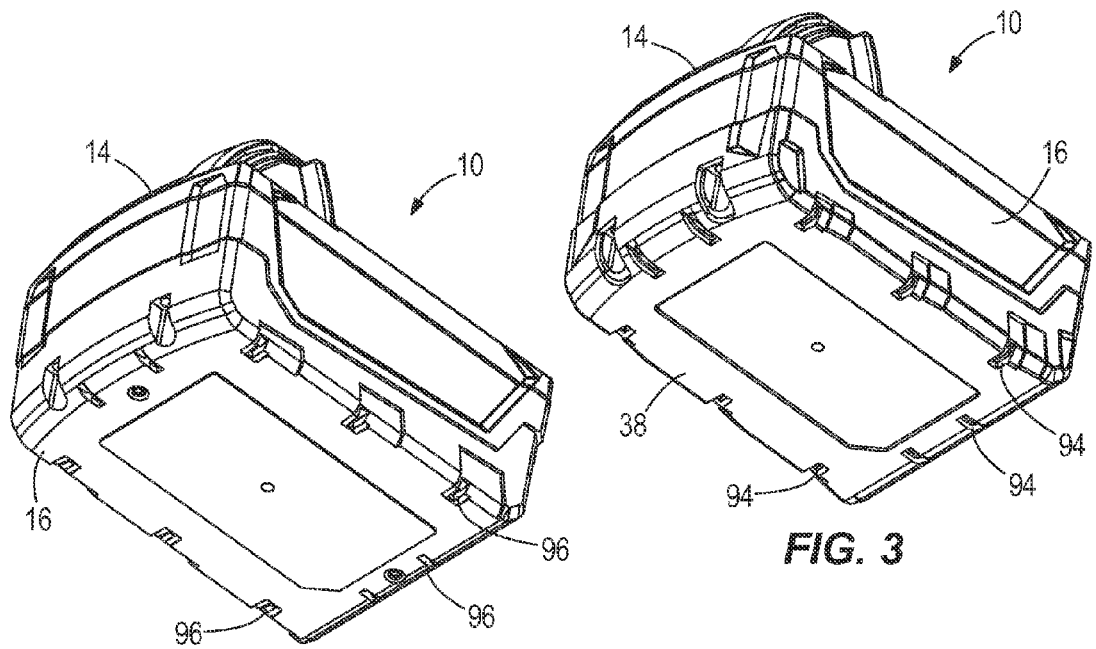
FIG. 2
FIG. 3

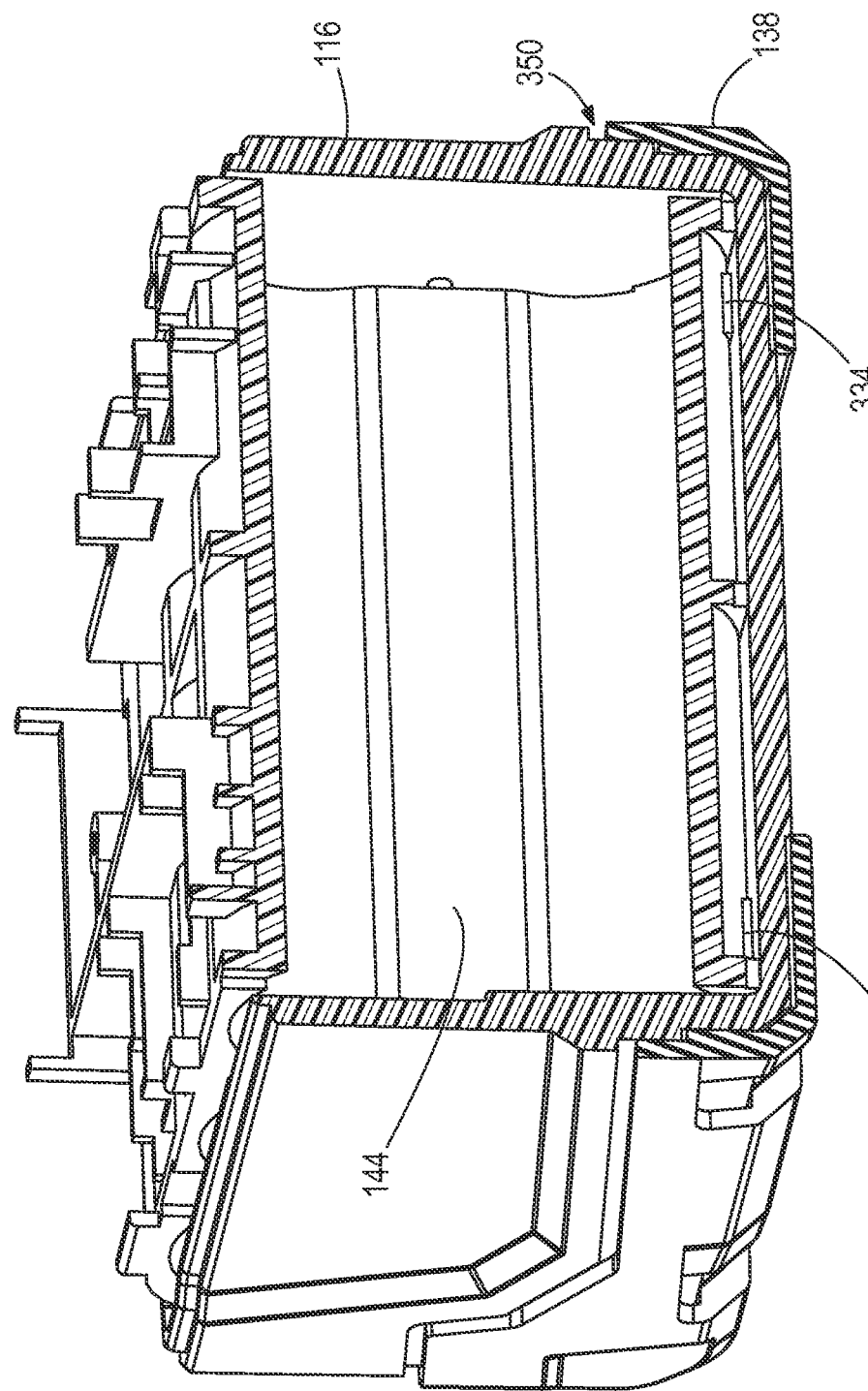

BATTERY PACK WITH MULTIPLE WATER DISCHARGE PATHWAYS

RELATED APPLICATIONS

This application claims priority to U.S. Provisional Patent Application Nos. 61/658,610 filed Jun. 12, 2012 and 61/710,390 filed Oct. 5, 2012, the entire contents of both of which are incorporated herein by reference.

BACKGROUND

The present invention relates to a battery pack. In particular, the invention relates to a battery pack including water infiltration protection.

The housing of a battery pack is susceptible to water ingress through openings in both a latch mechanism that secures the pack to the tool and openings that provide access to terminals of the battery pack. Introducing water into the battery pack may cause the batteries to rust, damage the internal electrical components (e.g., the circuit board), or otherwise cause battery malfunction.

SUMMARY

In a first embodiment, the invention provides a battery pack including a housing. The housing includes an inner cavity, an interface for receiving a power tool, and drain holes on a base portion. Battery cells are positioned within the inner cavity. A first latch member and a second latch member extend through the housing and are operable to secure the battery pack to the power tool. The battery pack also includes electrical terminals electrically coupled to the battery cells and operable to interface with the power tool. A latch cover supports the first and second latch members. A first water discharge pathway extends along the latch cover, downward along a first space between the battery cells and the housing, to the drain holes such that the first water discharge pathway directs water infiltrating the battery pack to the drain holes.

In another embodiment, the invention provides a battery pack including a housing. The housing includes an inner cavity, an interface for receiving a power tool, and drain holes on a base portion. Battery cells are positioned within the inner cavity. A first latch member and a second latch member extend through the housing and are operable to secure the battery pack to the power tool. The battery pack also includes electrical terminals electrically coupled to the battery cells and operable to interface with the power tool. A terminal cover includes openings that receive the electrical terminals. A first water discharge pathway extends from the openings of the terminal cover, downward along a first space between the battery cells and the housing, to the drain holes such that the first water discharge pathway directs water infiltrating the battery pack to the drain holes.

In yet another embodiment, the invention provides a battery pack including a housing. The housing includes an inner cavity, an interface for receiving a power tool, and drain holes on a base portion. Battery cells are positioned within the inner cavity. A first latch member and a second latch member extend through the housing and are operable to secure the battery pack to the power tool. The battery pack also includes electrical terminals electrically coupled to the battery cells and operable to interface with the power tool. The battery pack also includes a printed circuit board coupled to the electrical terminals. Additionally, a first cover is positioned between the interface and the printed circuit board. The first cover includes at least a portion of the first cover extending along a top surface of the circuit board and an overhang portion projecting downward along a side surface of the circuit board. A first water discharge pathway extends from the first cover downward along a first space between the battery cells, to the drain holes. The first water discharge pathway directs water infiltrating the battery pack to the drain holes.

In yet another embodiment, the invention provides a battery pack including a first housing portion secured to a second housing portion. The first housing portion defines an interface for receiving a power tool. The battery pack also includes a frame received within the second housing portion and constructed as a single piece. The frame includes openings, which secure a plurality of battery cells. More specifically, a pair of battery cells is stacked vertically within each of the openings and each battery cell includes a longitudinal axis oriented substantially perpendicular to a longitudinal axis of the battery pack. Further, a wedge is positioned in each opening between adjacent battery cells.

Other aspects of the invention will become apparent by consideration of the detailed description and accompanying drawings.

BRIEF DESCRIPTION OF THE DRAWINGS

FIGS. 1-3 are perspective views of a battery pack for a power tool that includes a housing having a first portion and a second portion according to one embodiment of the invention.

FIG. 31 is a cross-sectional view of FIG. 22 along 31-31 with the first portion and several internal structures removed, illustrating the second portion and the bottom cover relative to an internal frame that secures internal batteries.

DETAILED DESCRIPTION

Figure 4:
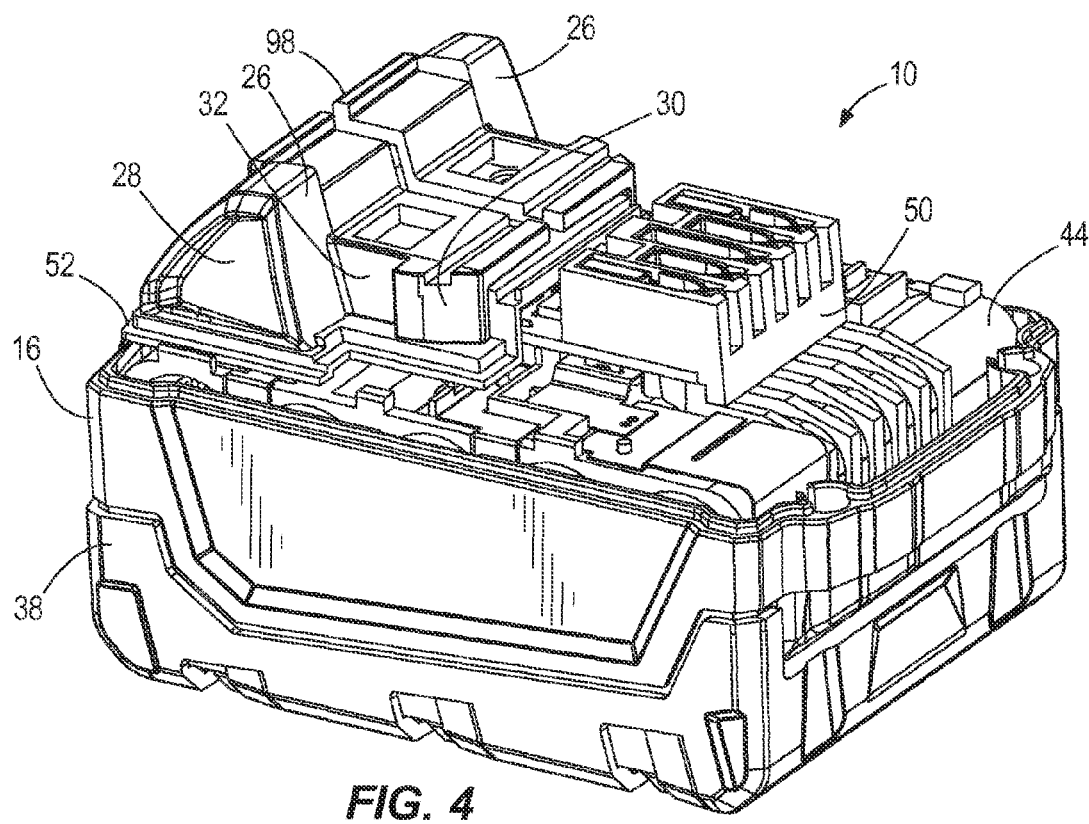
FIGS. 4-9 are perspective views of the battery pack of FIGS. 1-3 having the first portion of the housing removed and including a latch cover, a terminal cover, an internal frame, and a plurality of wedges.
Figure 5:
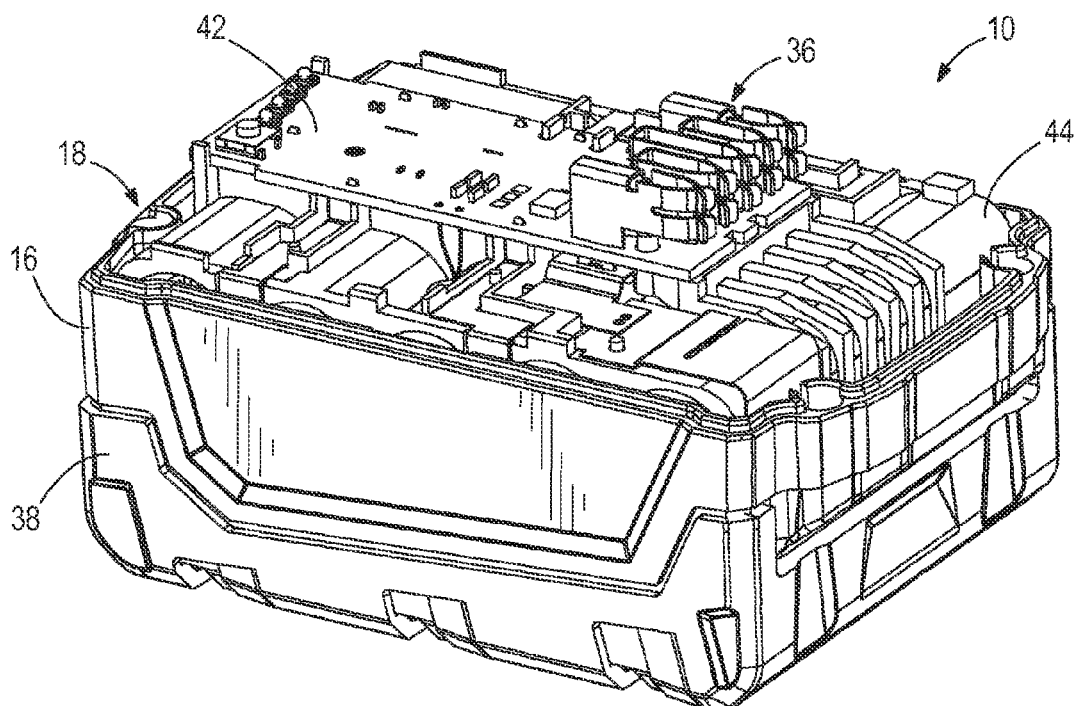
Figure 6:
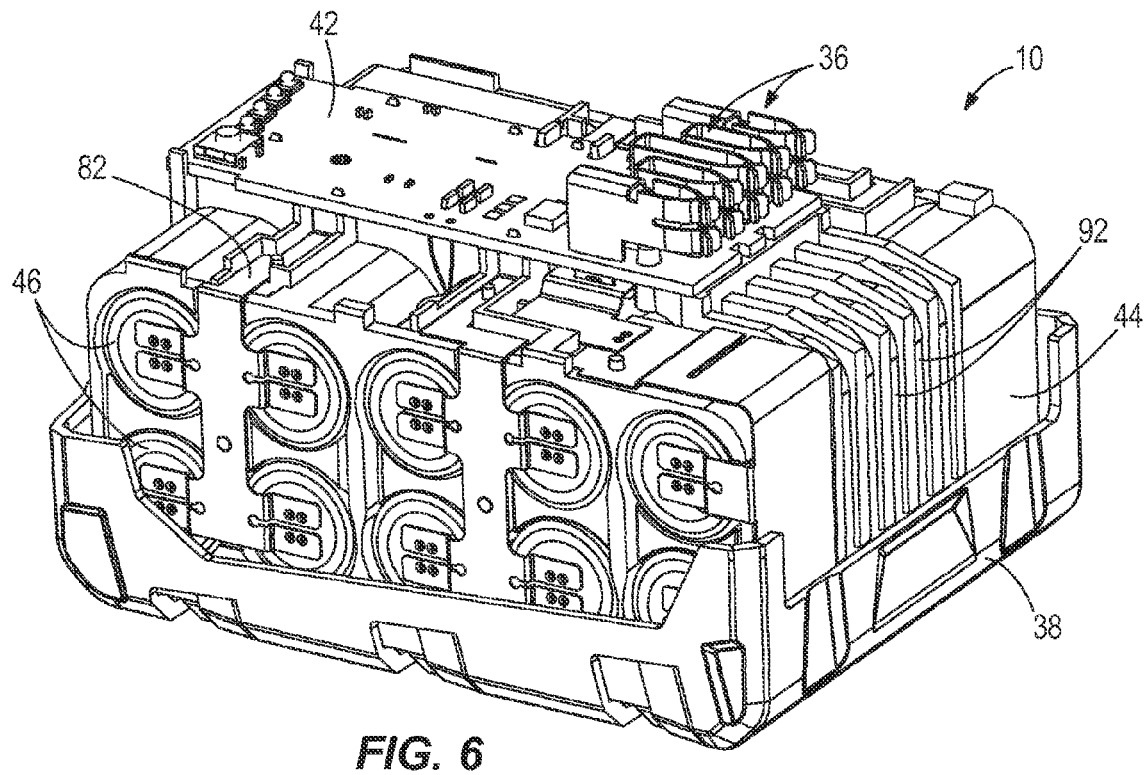

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

FIGS. 1-9 illustrate a battery pack 10 according to one embodiment of the invention. The battery pack 10 includes a housing or case 12 having a first portion 14 and a second portion 16. The two portions 14, 16 of the housing are coupled, for example, by fasteners (not shown) that extend through a plurality of complementary fastening holes 18. An interface 20 of the first portion 14, which is symmetrical about a longitudinal axis A, is able to be physically coupled to the base of a power tool (not shown). The first portion 14 includes a first and a second window or opening 22, 24, which accommodates a latch 26. The latch 26 includes a main body portion 28 and a hook portion 30 with a connecting portion 32 extending therebetween. The main body portion 28 is received within the first opening 22, while the hook portion 30 is received within the second opening 24. Although only one side of the first portion 14 is visible in the illustrated embodiment, an opposite side of the battery pack includes a similar construction such that there is a latch 26 on either side of the first portion 14. The first portion 14 further includes a plurality of openings 34 that surround terminals 36. The openings 34 ensure the alignment of the electrical connection between the power tool and the battery pack 10. The battery pack 10 also includes a bottom cover 38. The bottom cover 38 includes a plurality of holes or openings 94 that are aligned with holes or openings 96 in the second portion 16 of the housing 12 (FIGS. 2-3).

The battery pack 10 includes a printed circuit board (PCB) 42 that is physically coupled to an internal frame 44 that secures a plurality of batteries 46 within the second portion 16 of the housing 12. The terminals 36 project from a distal end 48 of the PCB 42 in the first portion 14. The terminals 36 and distal end 48 of the PCB 42 are covered by a terminal block or cover 50, while a latch block or cover 52 covers the PCB 42 on a proximal end 54. The latch cover 52 is located below the latches 26.

Figure 7:
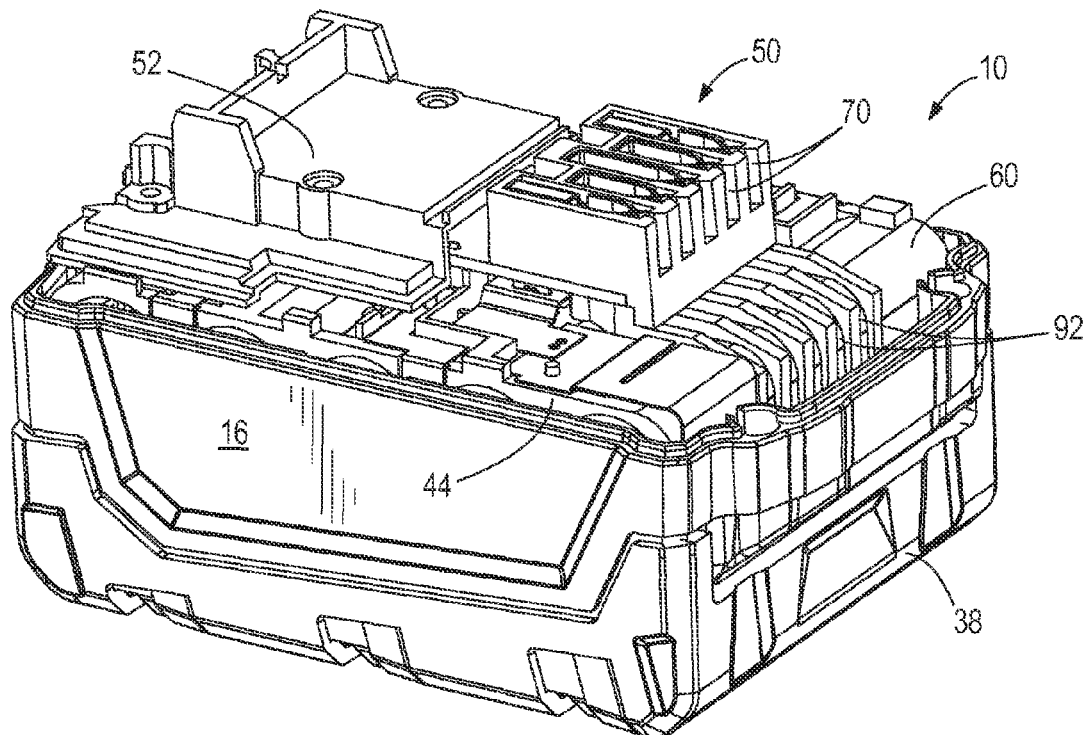
Figure 8:
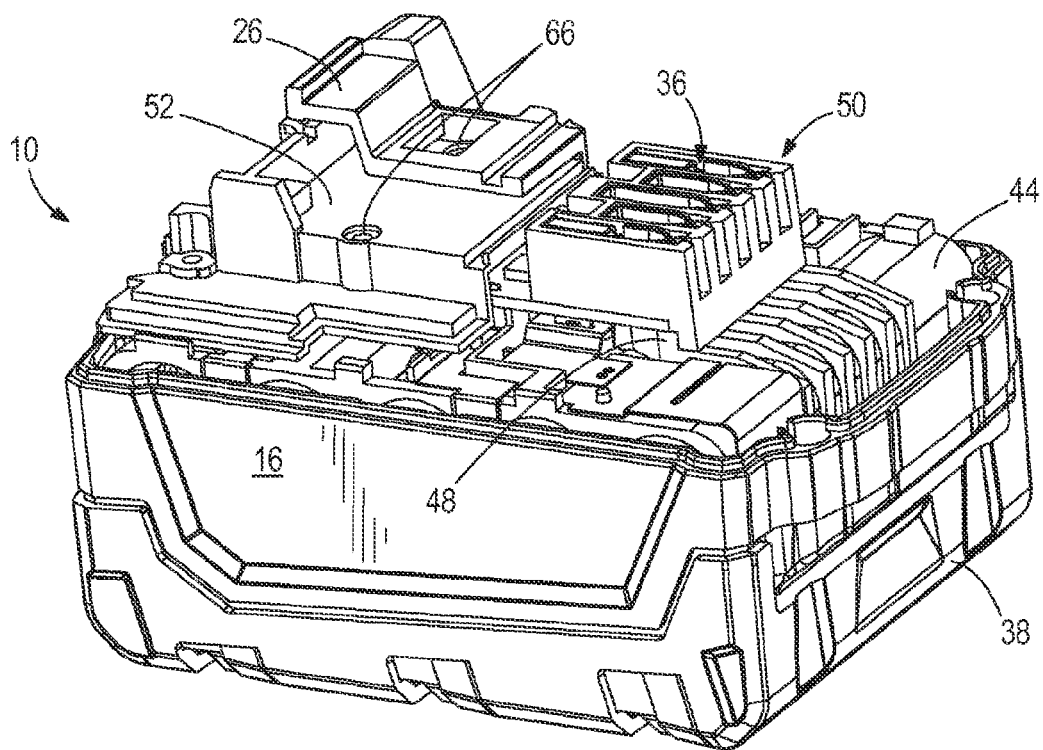
Figure 9:
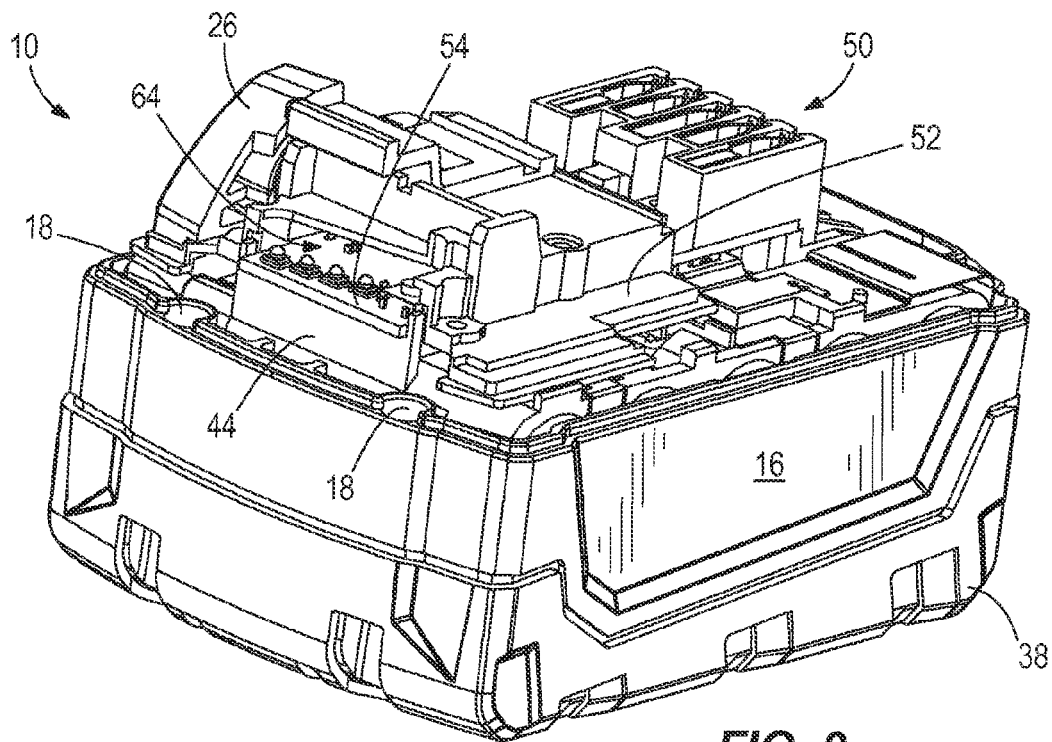
Figure 10:
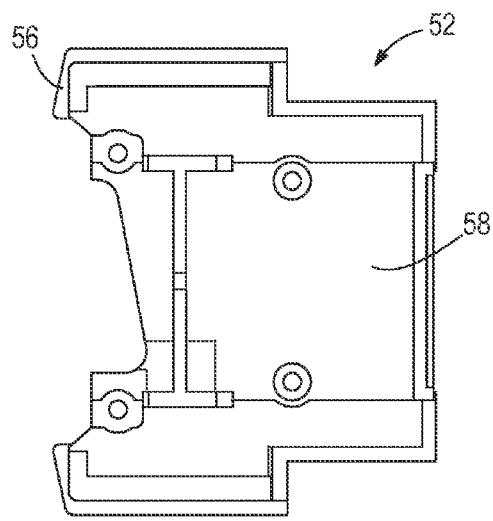
FIG. 10 is a top view of the latch cover.
Figure 11:
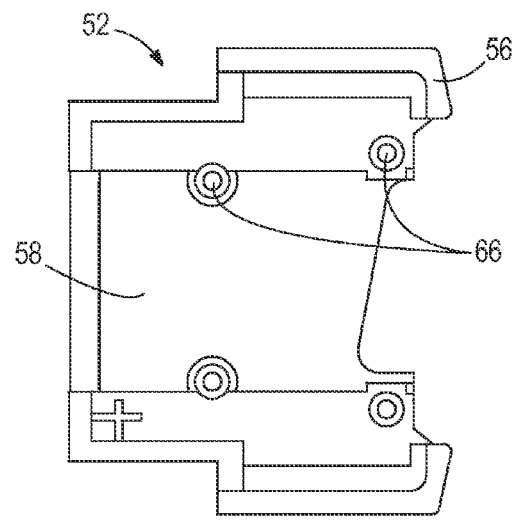
FIG. 11 is a bottom view of the latch cover of FIG. 10.
Figure 12:
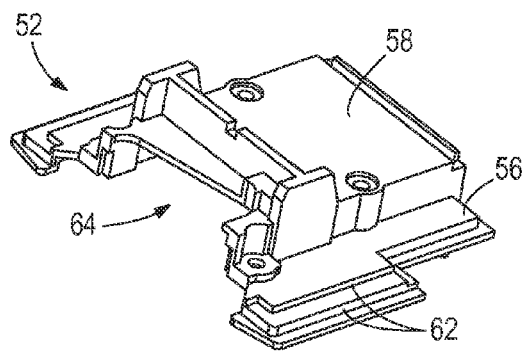
FIG. 12 is a front perspective view of the latch cover of FIG. 10.
Figure 13:
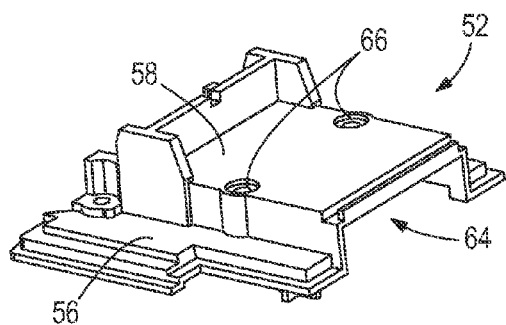
FIG. 13 is a rear perspective view of the latch cover of FIG. 10.
Figure 14:
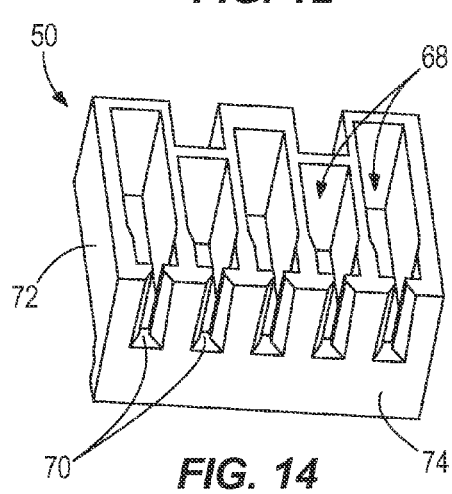
FIG. 14 is a front perspective view of the terminal cover.
Figure 15:
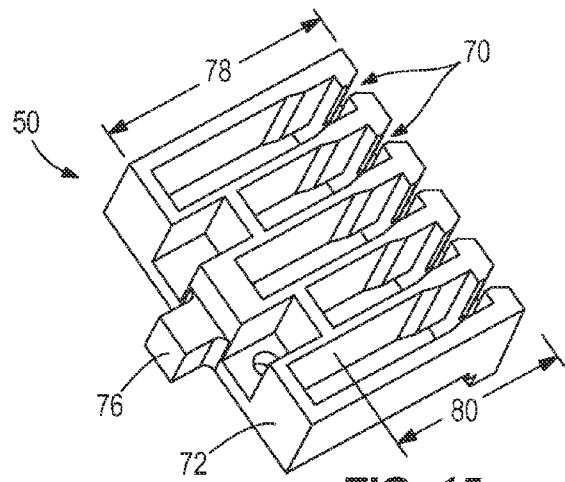
FIG. 15 is a rear perspective view of the terminal cover of FIG. 14.
Figure 16:
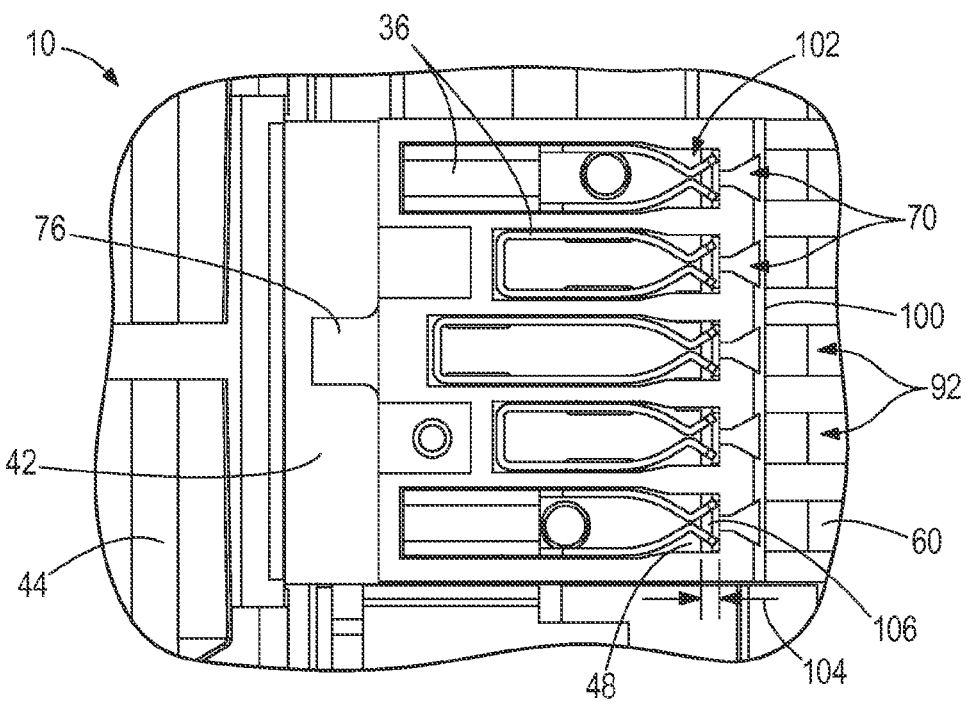
FIG. 16 is a top view of the terminal cover of FIG. 14 relative to other internal structures of the battery pack in FIGS. 4-9.
Figure 17:
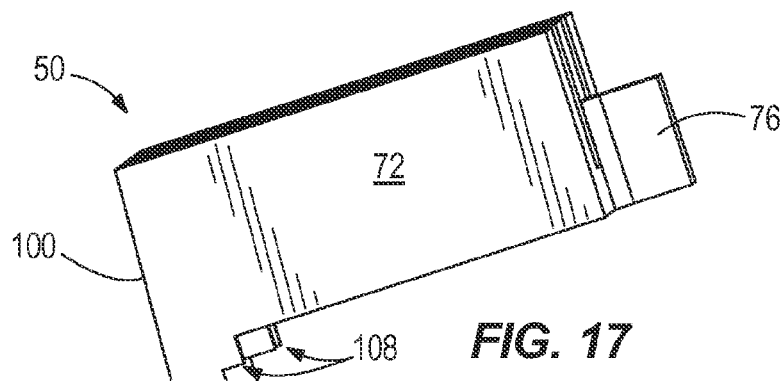
FIG. 17 is an additional perspective view of the terminal cover of FIG. 14.
Figure 18:
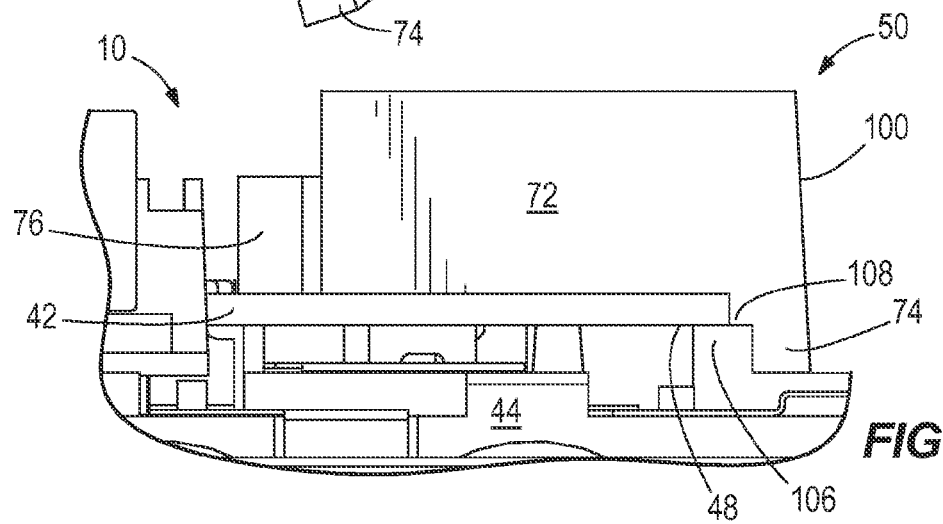
FIG. 18 is a side view of the terminal cover of FIG. 14 relative to other internal structures of the battery pack in FIGS. 4-9.
Figure 19:
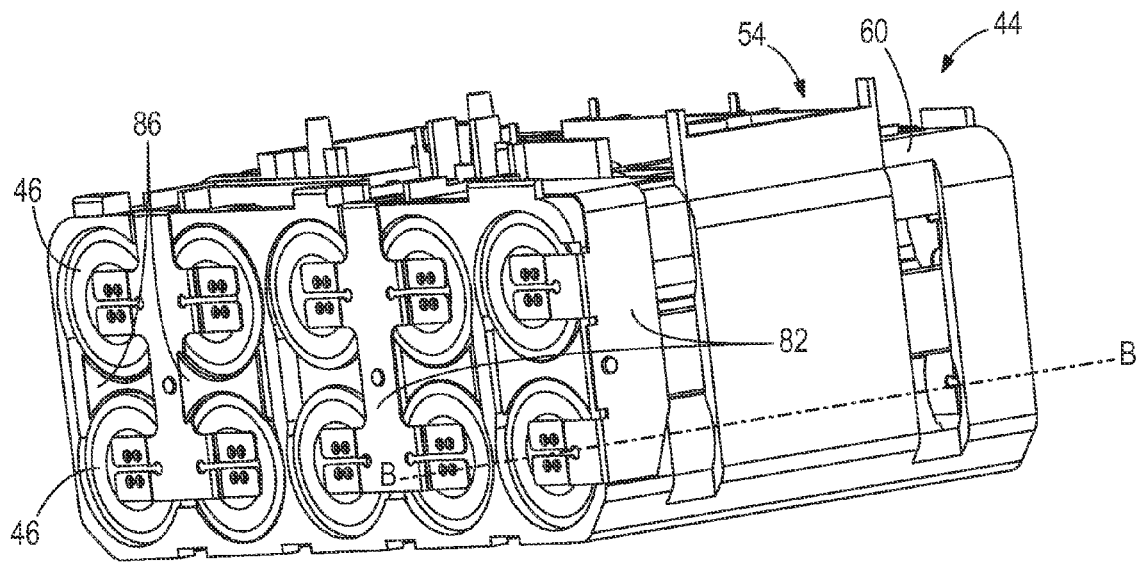
FIG. 19 is a perspective view of the internal frame.
Figure 20:
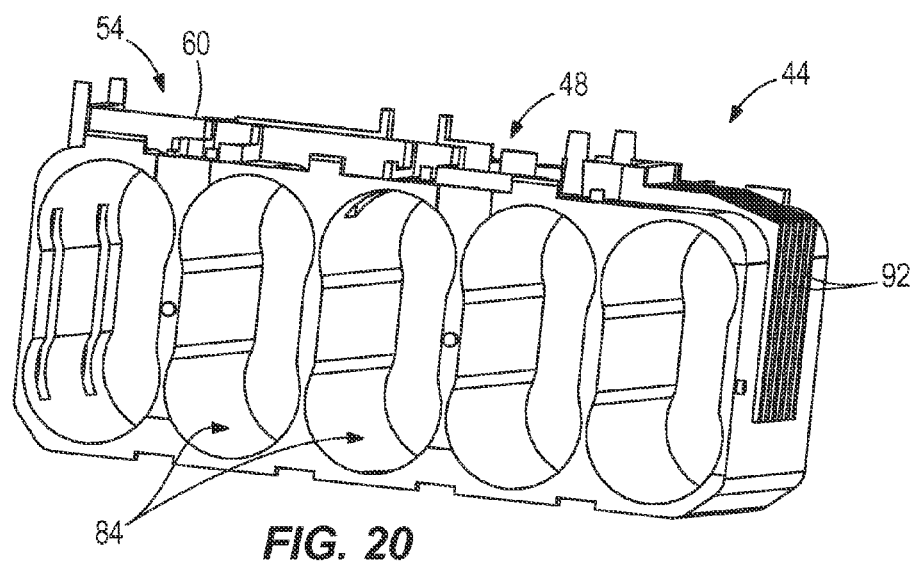
FIG. 20 is an additional perspective view of the internal frame.
Figure 21:
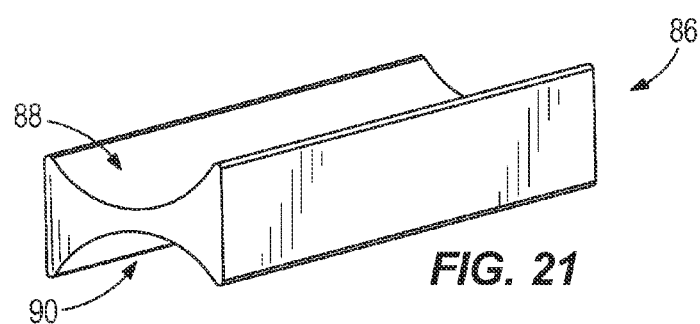
FIG. 21 is a perspective view of a wedge of the battery pack according to one embodiment of the invention.
Figure 22:
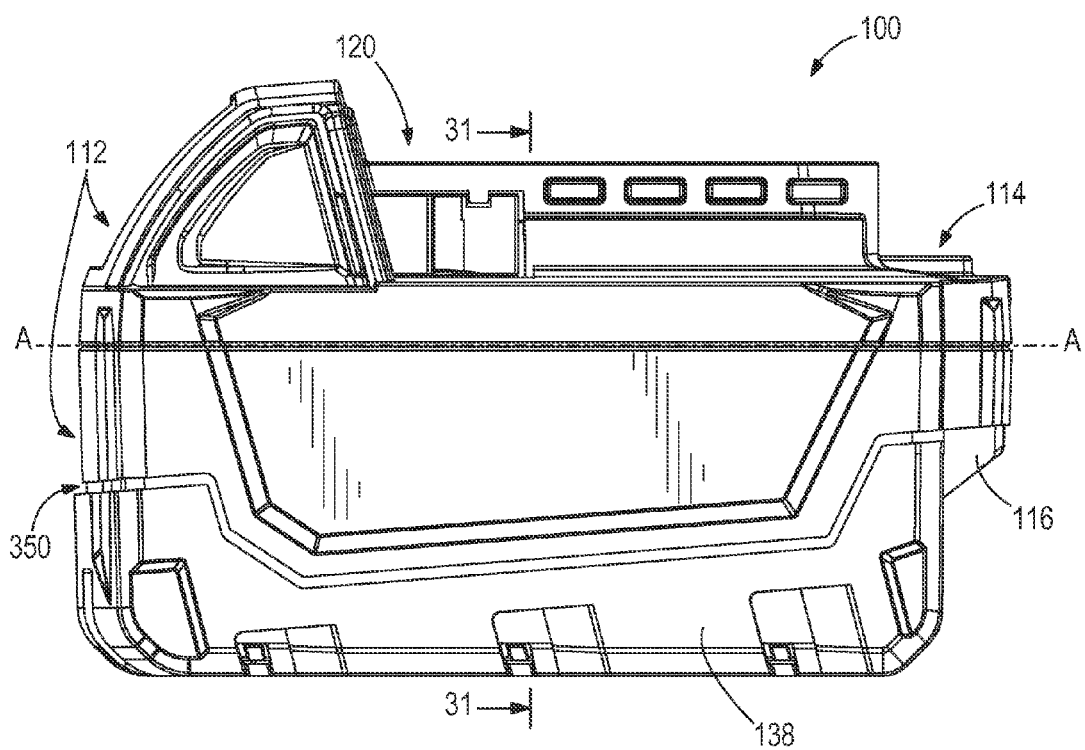
FIG. 22 is a perspective view of a battery pack for a power tool that includes a housing having a first portion, a second portion, and a bottom cover according to another embodiment of the invention.
Figure 23:
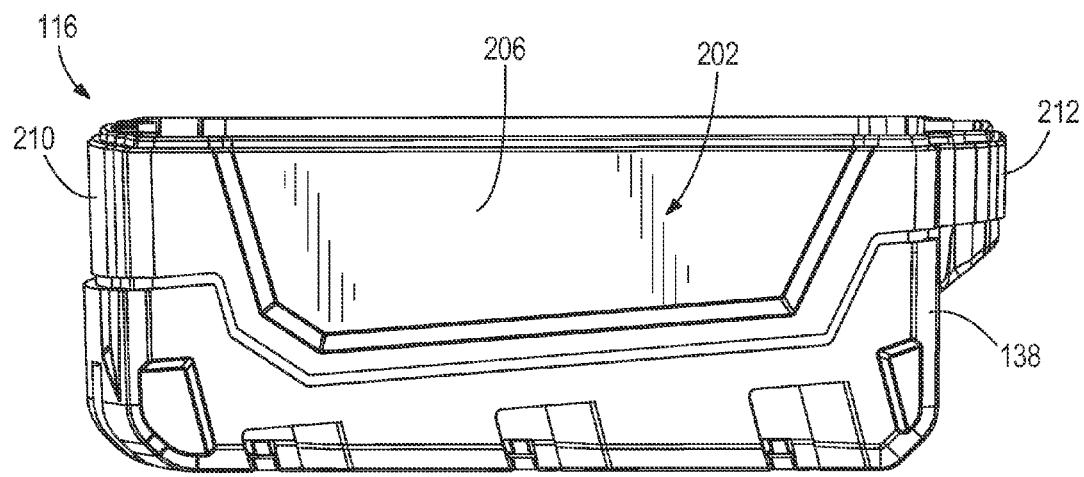
FIG. 23 is a side view of the second portion and bottom cover of the battery pack of FIG. 22.
Figure 24:
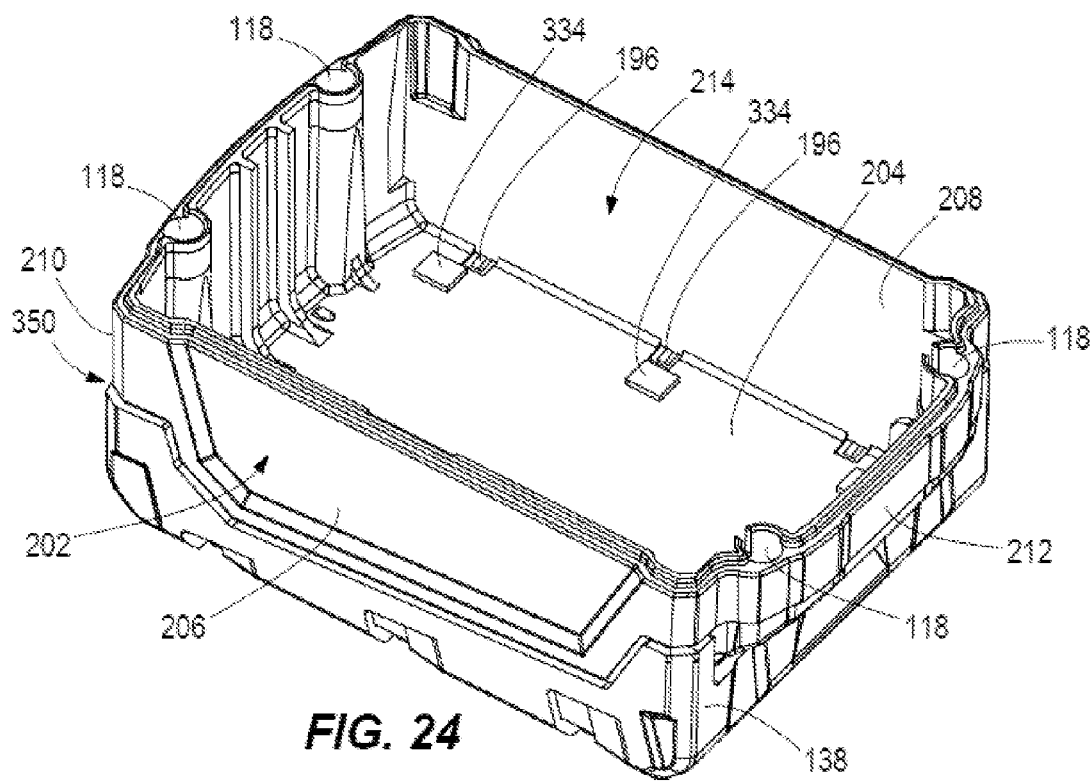
FIGS. 24-25 are perspective views of the second portion and a bottom cover of the battery pack of FIG. 22 with all internal components removed thereby illustrating a cavity of the second portion.
Figure 26:
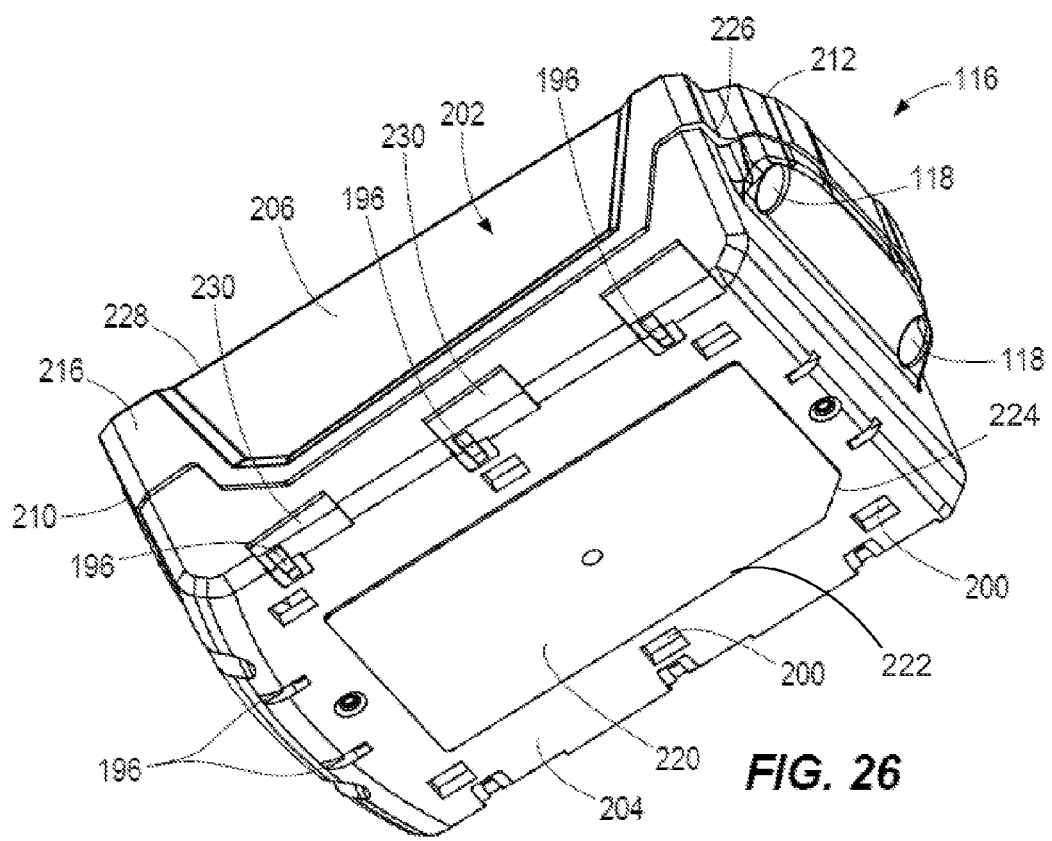
FIGS. 26-27 are perspective views of the second portion of FIGS. 24 and 25 with the bottom cover removed.
Figure 25:
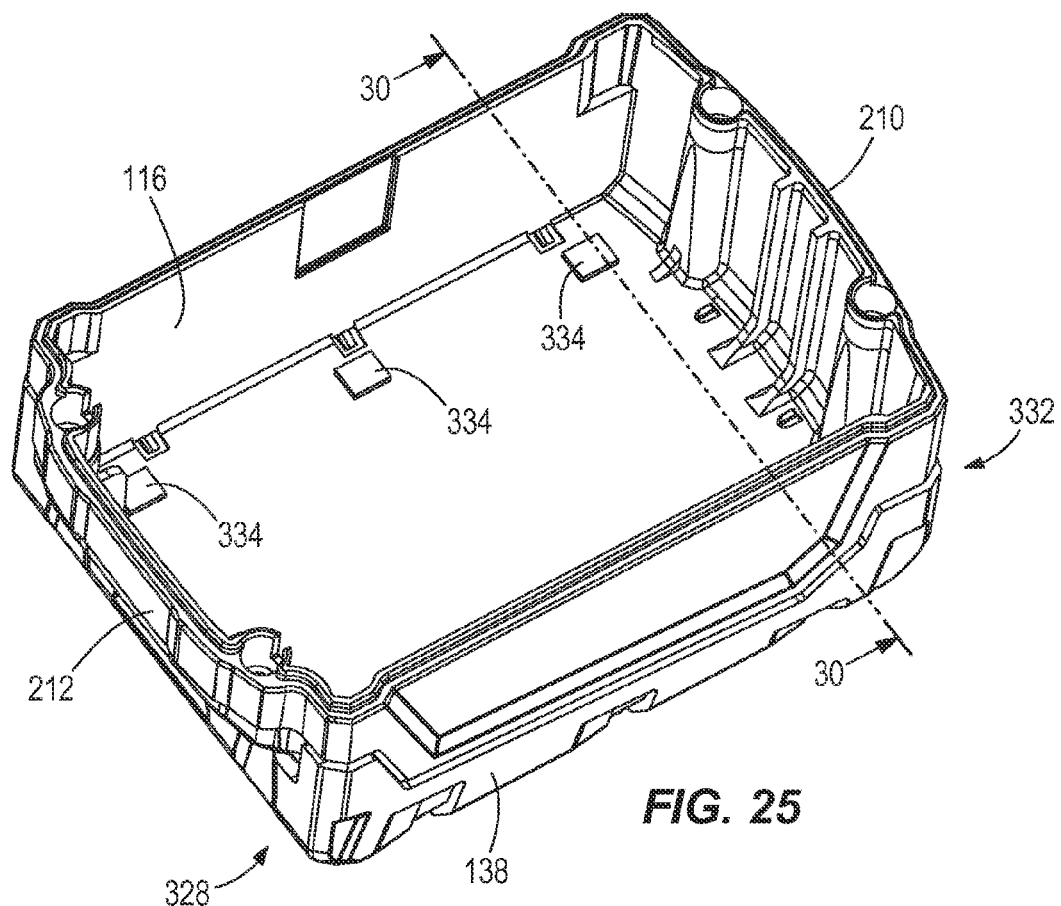
Figure 30:
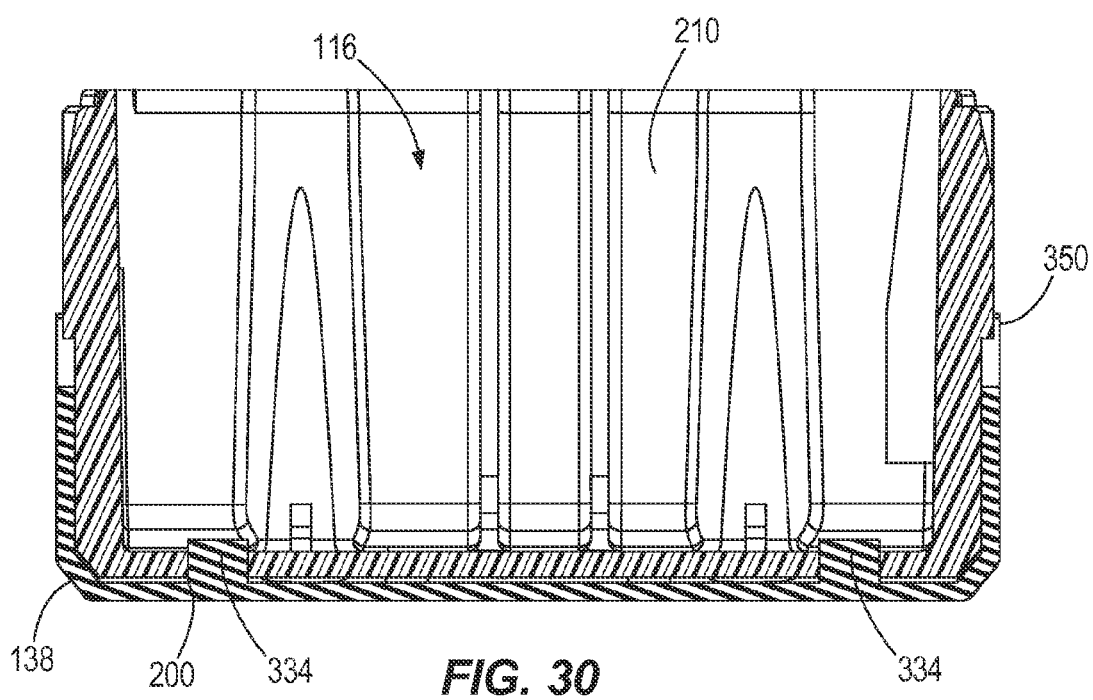
FIG. 30 is a cross-sectional view of the second portion and the bottom cover of FIG. 25 along 30-30.
Figure 27:
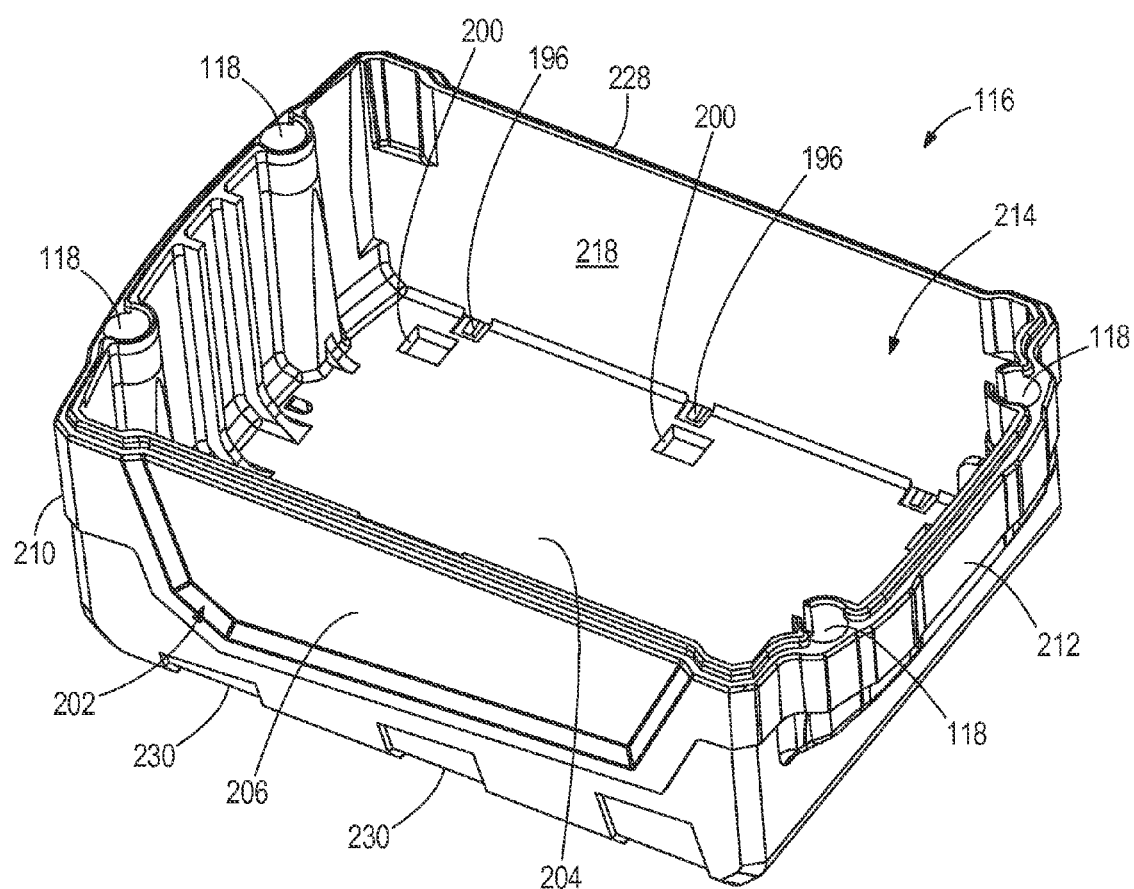
Figure 28:
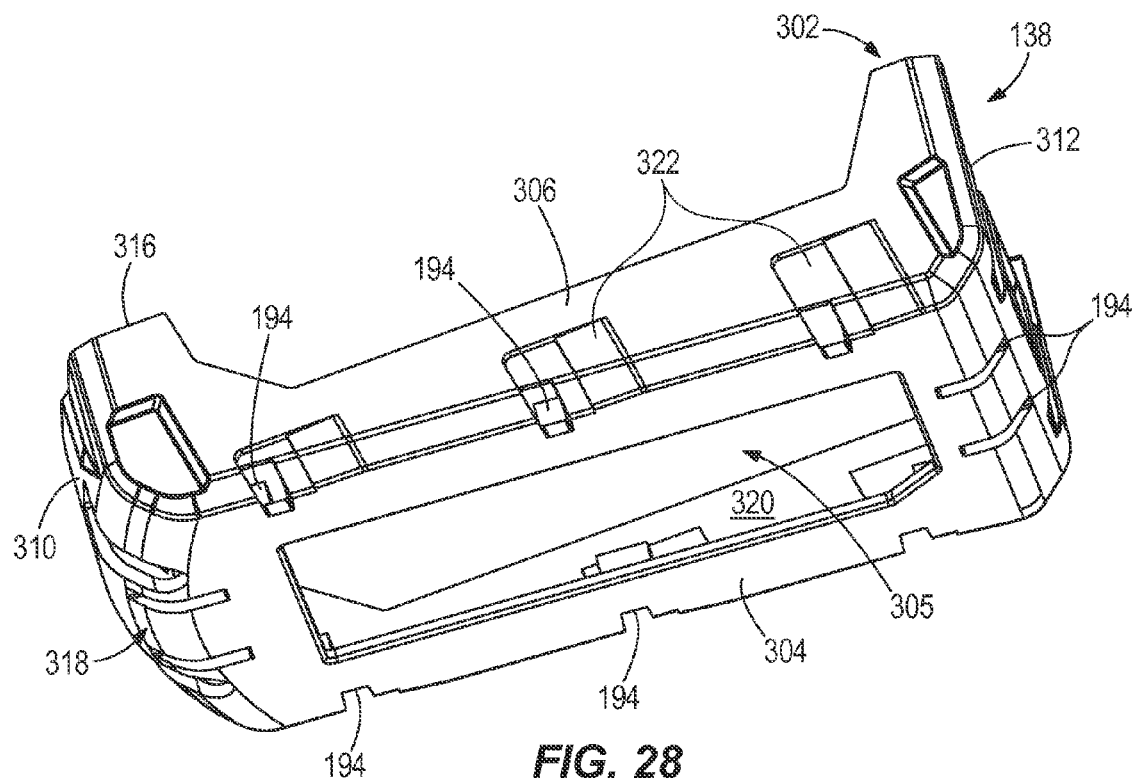
FIGS. 28-29 are perspective views of the bottom cover of FIGS. 24 and 25 removed from the second portion.
Figure 29:
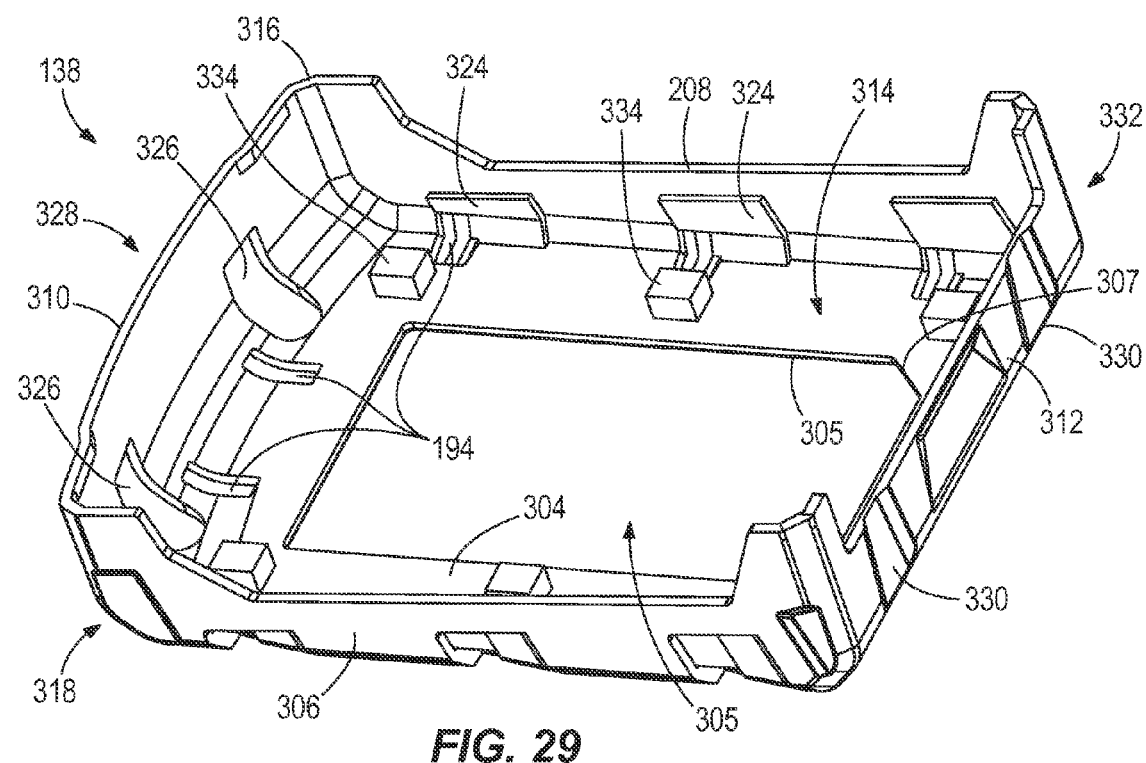

FIGS. 4-9 and 19-20 illustrate the internal frame 44. The internal frame 44 is constructed as a single piece and includes openings 84 and weld straps 82. The openings 84 are sized to accommodate batteries 46 having a longitudinal axis B. The batteries 46 are secured within the openings 84 by wedges 86 (FIGS. 19 and 21). The wedges 86 include a first recessed portion 88 and a second recessed portion 90 that are approximately the same size and shape as the batteries 46 such that the batteries 46 rest within the recessed portions 88, 90. The wedges 86 enable the use of the different sized batteries to be stacked within the openings 84. The weld straps 82 interconnect the batteries 46 to one another and also couple the batteries 46 to the PCB 42. The internal frame 44 includes channels 92 that are aligned with the channels or openings 70 of the terminal cover 50 (FIG. 7). In the illustrated embodiment, the batteries 46 are oriented horizontally such that the longitudinal axis B is perpendicular to the axis A of the battery pack 10. The batteries 46 are also stacked vertically in rows within the openings 84 of the frame 44. In further embodiments, the frame 44 includes openings 84 such that the batteries 46 are oriented in other suitable directions. Further, while the recessed portions 88, 90 and the openings 84 in the illustrated embodiment are substantially semi-circular and ovular, respectively, further embodiments include recessed portions and openings of alternative sizes and shapes in order to receive batteries of alternative sizes and shapes.

FIGS. 10-13 illustrate the latch cover 52. The latch cover 52 is to prevent water infiltration into the battery pack 10, and also protects the PCB 42 by preventing water that enters the battery pack 10 between the first portion 14 of the housing 12 and the latches 26 from reaching the PCB 42. The latch cover 52 includes a base portion 56 and an elevated portion 58. The base portion 56 is located on an upper portion 60 of the internal frame 44. The base portion 56 includes plurality of ridges or projections 62 and is partially visible while the battery pack 10 is assembled (FIG. 1). The elevated portion 58 creates a space 64 above the PCB 42. The latches 26 fit snugly on opposite sides of the latch cover 52 and define a space 98 therebetween. In the illustrated embodiment, the latch cover 52 is secured to the top cover 12 by fasteners (not shown) that extend through a plurality of fastening holes 66. However, in further embodiments the latch cover 52 may be secured to the internal frame 44. Together, the main portion 56 and the elevated portion 58 protect the PCB 42 by redirecting water between the internal frame 44 and the second portion 16 of the housing 12 towards the bottom cover 38 where it is expelled through the holes 94, 96 of the second portion 16 and bottom cover 38.

FIGS. 14-18 illustrate the terminal cover 50. The terminal cover 50 includes a first portion 72, which rests on the distal end 48 of the PCB 42, and a second portion 74 that extends below the distal end 48 of the PCB 42, which rests on the upper portion 60 of the internal frame 44. The terminal cover also includes a tooth 108 (FIG. 17) on each side of terminal cover 50, which rests on a projection 106 of the internal frame 44. The terminal cover 50 includes a projection 76, which also rests against the PCB 42. The terminal cover 50 further includes openings 68 having channels 70 on a distal end 100 of the terminal cover 50. The terminals 36 are received within the openings 68 such that portions 102 of the terminals 36 abut the terminal cover 50 at the distal end 100 thereby preventing water from entering the battery pack 10. The channels 70 assist in aligning the female terminals 36 of the battery pack 10 and the male terminals of the power tool (not shown). Further, in the event that water should enter between the first portion 14 of the housing 12 and the terminals 36, there is a gap 104 between the distal end 48 of the PCB 42 and the terminal cover 50 that prevents water from reaching the PCB 42. The projection 106 of the internal frame 44 is located below gap 104 so that water falls through the gap 104 and is redirected towards bottom of battery pack 10 and through the holes 94, 96 of the second portion 16 and bottom cover 38 via the channels 92 of the internal frame 44. Because the terminals 36 have various sizes and the openings 68 are sized to accommodate the terminals 36, the openings 68 may have different dimensions. For example, the terminal cover 50 has a first length 78 and a second length 80 associated with different terminal blade sizes of the terminals 36.

FIGS. 22-33 illustrate a battery pack 100 according to another embodiment of the invention. The battery pack 100 of FIGS. 22-33 is similar to the battery pack 10 of FIGS. 1-9; therefore, like structures will be identified by like references numbers plus "100" and only the differences will be discussed hereafter.

The battery pack 100 includes a housing or case 112 having a first portion 114 (i.e., a top housing) and a second portion 116 (i.e., a bottom housing), which are coupled along a longitudinal axis A. The two portions 114, 116 of the housing 112 are coupled, for example, by fasteners (not shown) that extend through a plurality of complementary fastening holes 118. An interface 120 of the first portion 114 is able to be physically coupled to the base or other battery receiving portion of a power tool (not shown).

Figure 32:
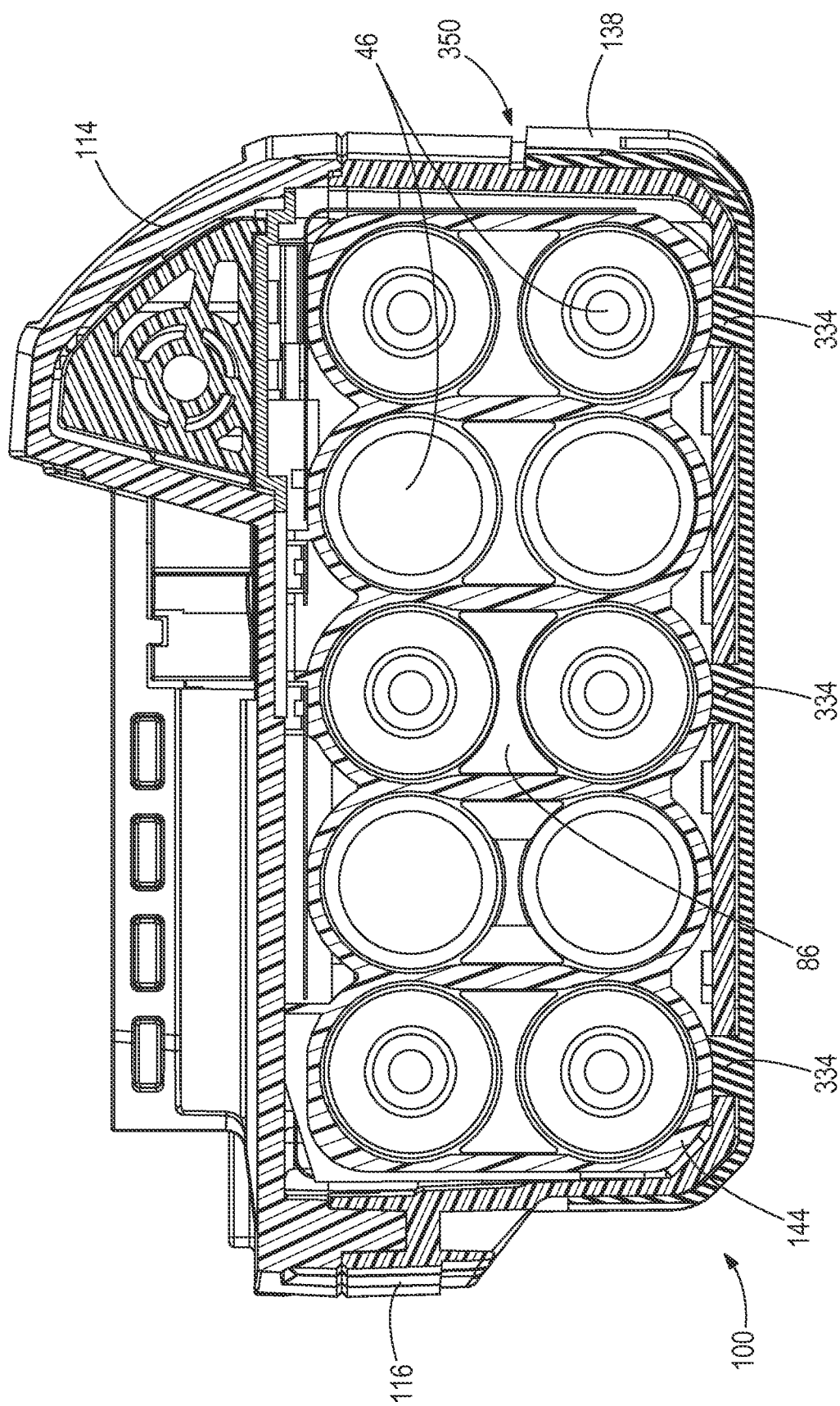
FIG. 32 is a side view of FIG. 22 having a side wall removed and illustrating the second portion and the bottom cover relative to an internal frame that secures batteries.

With reference to FIGS. 23-27, the second portion 116 of the housing includes body 202 having a bottom wall 204 integrally formed with four side walls 206-212 creating a cavity 214 therein. The cavity 214 receives an internal frame 144 that together with a plurality of wedges 86 secures batteries 46 within the battery pack 100 (FIGS. 31 and 32). The battery pack 100 includes an outer surface 216 and an inner surface 218. The outer surface 216 of the bottom wall 204 that includes a reinforced area 220 having ridge 222 that defines a substantially rectangularly shaped area and one chamfered corner 224. The outer surface 216 of the second portion 116 includes a step or ridge 226 that is intermediate between the bottom wall 204 and a top edge 228 and extends along sidewalls 206-212. The outer surface 216 additionally includes recessed portions 230. The second portion 116 includes a plurality of openings or holes 196 that extend from the bottom wall 204 to each of the side walls 206-212; the holes 196 are located within the recessed portions 230 of the exterior surfaces 216. The bottom wall 204 includes a plurality of apertures 200. The holes 196 and apertures 200 extend from the outer surface 216 of the battery pack 100 to the inner surface 218. The holes 196 and the apertures 200 are offset relative to one another. The holes 196 and apertures 200 may be created by extrusion or any other suitable manufacturing process. In the illustrated embodiment, there are eight holes 196 and six apertures 200; further embodiments may include fewer or more holes 196 and apertures 200.

The battery pack 100 also includes a bottom cover or overmold 138 illustrated in FIGS. 22-24 and 28-29. The bottom cover 138 includes a body 302 having a bottom wall 304 integrally formed with four side walls 306-312 creating a cavity 314 therein. An upper boundary of the cavity 314 is defined by an edge 316 created by the four side walls 306-312. The bottom wall 304 defines a rectangular opening or cutout 305. The bottom cover 138 has an outer surface 318 and an inner surface 320. The outer surface 318 includes a plurality of recessed areas 322 that correspond to a plurality of projections 324 on the inner surface 320 of the bottom cover 138. The bottom cover 138 accommodates the insertion and removal of fasteners (not shown) via two through-holes 326 on a first end 328 and two recesses 330 on a second end 332. The bottom cover 138 also includes a plurality of holes or openings 194 that extend from the bottom wall 304 to the side walls 306-312. The holes 194 are located within the recessed areas 322 of the bottom cover 138. The bottom cover 138 additionally includes a plurality of bumpers or projections 334 that are integrally formed with the inner surface 320. In the illustrated embodiment, the bottom cover includes six holes 194 and six bumpers 334. Further embodiments may include more or less holes and bumpers.

Figure 33:
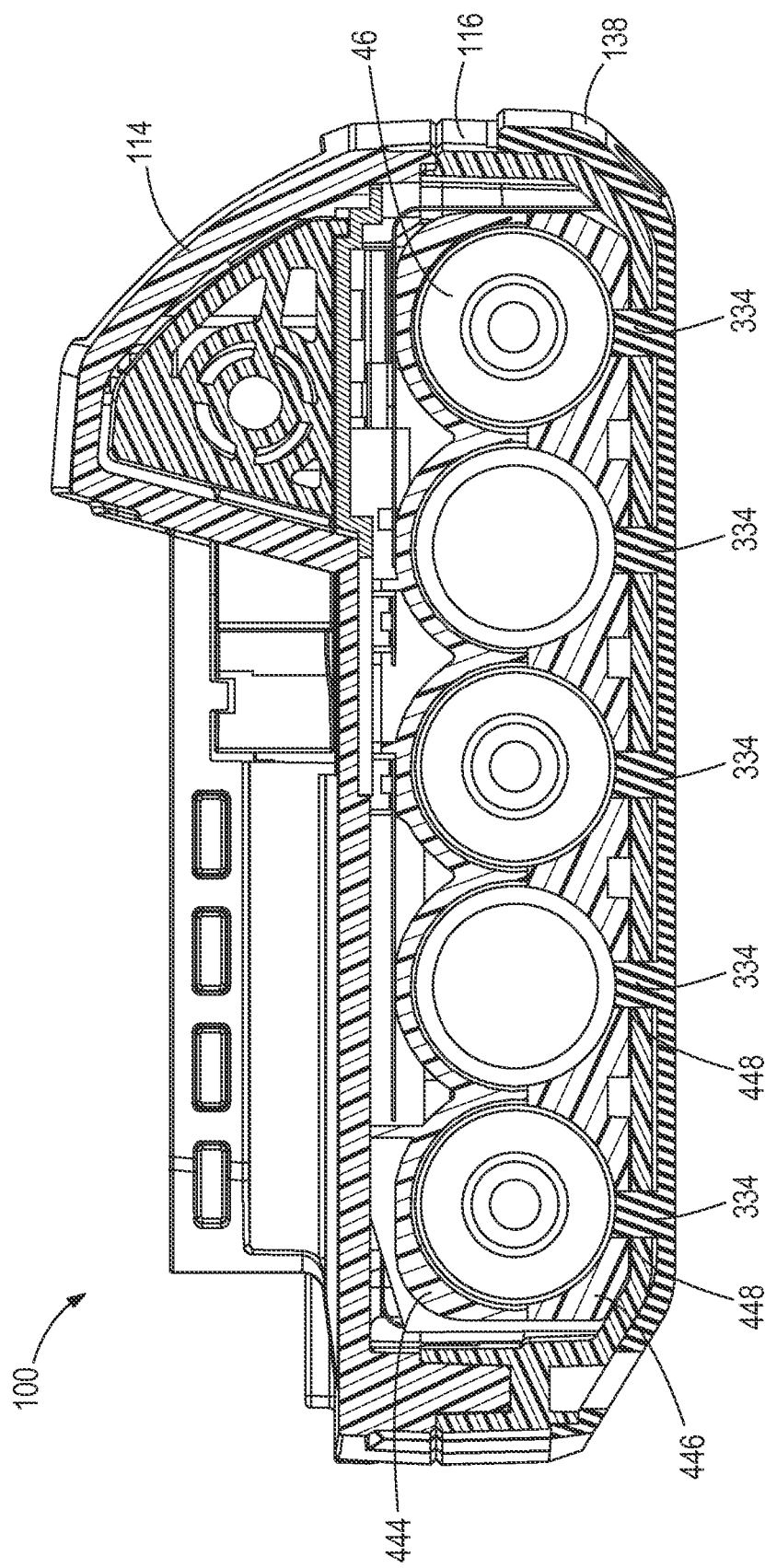
FIG. 33 is a side view of a battery pack according to another embodiment of the invention having a side wall removed and illustrating the second portion and the bottom cover relative to an alternate internal frame that secures batteries.

FIGS. 22-24 and 28-32 illustrate that, when assembled, the bottom cover 138 overlays the second portion 116 of the battery pack 100. As such, an interface 350 is created at the top edge 316 of the bottom cover 138, which complements and aligns with the step 226 in the second portion 116 of the battery pack 100. The bumpers 334 of the bottom cover 138 extend through the apertures 200 in the second portion 116, which further ensures the proper alignment of the bottom cover 138 with respect to the second portion 116. In the embodiments illustrated in FIGS. 30 and 31, the internal frame 144 sits on the bumpers 334. Alternatively, FIG. 33 illustrates another embodiment that includes a first frame member 444 and a second frame member 446 that, together, support a single row of batteries 46. The second frame member 446 includes apertures 448 that receive bumpers 334 in the bottom cover 138. In the embodiment illustrated in FIG. 33, an aperture 448 and bumper 334 are associated with each battery 46; in alternate embodiments, the number of bumpers and apertures do not equal the number of batteries housed within the battery pack 100. In either embodiment, the bumpers 334 take up tolerance between the internal frame 144, 446 and the second portion 116 of the battery pack 100, and also function as shock-absorbers if the pack 100 is dropped or under conditions of high vibration. Additionally, the bottom cover 138 improves the user's grip, for instance, when inserting the battery pack and removing the battery pack into and from the power tool. The bottom cover 138 also prevents the battery pack from sliding across surfaces. When the bottom cover 138 overlays the second portion 116 of the battery pack 100, the holes 194 in the bottom cover 138 are aligned with holes or openings 196 in the second portion 116 of the housing 112. The bottom holes 194, 196 are drain holes that allow any water that infiltrates the cavity 214 to exit the housing 112 rather than pooling inside the cavity 214. The rectangular cutout 305 in the bottom cover 137 receives the reinforced area 220 in the bottom wall 204 of the second portion 116 of the battery pack 100. The recesses 230 in the outer surface 216 of the second portion 116 correspond to the projections 324 along the inner surface 320 of the bottom cover. In this way, the contours of the second portion 116 and the bottom cover 138 are complementary. In embodiment of FIGS. 22-24 and 28-32, the number of holes 194 in the bottom cover 138 corresponds to the number holes 196 in the second portion 116. Similarly, the number of bumpers 334 corresponds to the number of apertures 200 in the second portion 116. In further embodiments, there may not be a 1:1 relationship between these components.

In the illustrated embodiments, the housing 12, 112 of the battery packs 10, 100 as well as the bottom covers 38, 138 are constructed from plastic. Further embodiments the housing and covers may be constructed from any suitable material.

Thus, the invention provides, among other things, a battery pack including water infiltration protection via a latch and terminal cover, which direct water away from a PCB to a bottom of the battery case housing. Further, the invention provides an internal frame for securing a plurality of batteries and constructed from a single piece. Additionally, the invention provides wedges that also participate in securing the batteries and allow the use of different size batteries, as well. The battery pack also includes an overmold that participates in shock-absorption, prevents the battery pack from sliding, and improves the users grip when inserting and removing the battery pack into and from the power tool. Various features and advantages of the invention are set forth in the following claims.

What is claimed is:

1. A battery pack comprising:
a housing including an inner cavity, an interface for receiving a power tool, and drain holes on a base portion of the housing;
battery cells positioned within the cavity;
a first latch member extending through the housing;
a second latch member extending through the housing, the first and second latch members operable to secure the battery pack to the power tool;
electrical terminals electrically coupled to the battery cells and operable to interface with the power tool;
a latch cover within the inner cavity of the housing supporting the first and second latch members;
a first water discharge pathway extending along the latch cover, downward along a first space between the battery cells and the housing, to the drain holes;
wherein the first water discharge pathway directs water infiltrating the battery pack to the drain holes;
a terminal cover including openings; and
a second water discharge pathway including multiple substantially parallel channels extending from the openings of the terminal cover, downward along a second space between the battery cells and the housing, to the drain holes, wherein the second water discharge pathway directs water infiltrating the battery pack to the drain holes.

2. The battery pack of claim 1, wherein the latch cover includes a base portion having a first side and a second side and an elevated portion, the elevated portion extending between the first and second sides of the base portion.

3. The battery pack of claim 2, wherein the elevated portion defines a space between the latch cover and the battery cells.

4. The battery pack of claim 1 further comprising a printed circuit board positioned between the latch cover and the battery cells.

5. The battery pack of claim 4, wherein the latch cover is disposed between an upper portion of the housing and the printed circuit board.

6. The battery pack of claim 4, wherein the latch cover includes a first side and a second side, the first and second sides extending beyond opposite sides of the printed circuit board.

7. The battery pack of claim 1, wherein the first latch member is positioned above a first portion of the latch cover and the second latch member is positioned above a second portion of the latch cover, the first and second latch members being movable relative to one another and the latch cover.

8. The battery pack of claim 1, wherein the latch cover is at least partially exposed to an exterior of the housing.

9. The battery pack of claim 1, wherein the openings of the terminal cover receive the electrical terminals.

10. A battery pack comprising:
a housing including an inner cavity, an interface for receiving a power tool, and drain holes on a base portion of the housing;
battery cells positioned within the cavity;
a first latch member extending through the housing;
a second latch member extending through the housing, the first and second latch members operable to secure the battery pack to the power tool;
a latch cover within the inner cavity of the housing providing a horizontal support base for the first and second latch members;
electrical terminals electrically coupled to the battery cells and operable to interface with the power tool;
a terminal cover including openings that receive the electrical terminals; and
a first water discharge pathway including multiple substantially parallel channels extending from the openings of the terminal cover, downward along a first space between the battery cells and the housing, to the drain holes,
wherein the first water discharge pathway directs water infiltrating the battery pack to the drain holes.

11. The battery pack of claim 10 wherein the terminal cover is at least partially exposed to an exterior of the housing.

12. The battery pack of claim 10 further comprising a printed circuit board positioned between the terminal cover and the battery cells.

13. The battery pack of claim 12, wherein the terminal cover is disposed between the interface and the printed circuit board.

14. The battery pack of claim 12, wherein the terminal cover includes a first portion and a second portion, the first portion supported on the printed circuit board and the second portion projecting downward along a side surface of the printed circuit board.

15. The battery pack of claim 10 further comprising a second water discharge pathway extending along the latch cover, downward along a second space between the battery cells and the housing, to the drain holes, wherein the second water discharge pathway directs water infiltrating the battery pack to the drain holes.

16. The battery pack of claim 10 further comprising an internal frame including channels that substantially align with the openings of the terminal cover, wherein the first water discharge pathway further includes the channels.

17. A battery pack comprising:
a housing including an inner cavity, an interface for receiving a power tool, and drain holes on a base portion of the housing;
battery cells positioned within the cavity;
a first latch member extending through the housing;
a second latch member extending through the housing, the first and second latch members operable to secure the battery pack to the power tool;
electrical terminals electrically coupled to the battery cells and operable to interface with the power tool;
a printed circuit board coupled to the electrical terminals;
a first cover within the inner cavity of the housing positioned between an upper portion of the housing and the printed circuit board, at least a portion of the first cover extending along a top surface of the printed circuit board and an overhang portion of the first cover projecting downward along a side surface of the printed circuit board;
a first water discharge pathway extending from the first cover downward along a first space between the battery cells, to the drain holes,
wherein the first water discharge pathway directs water infiltrating the battery pack to the drain holes;
a second cover positioned between the interface and the printed circuit board; and
a second water discharge pathway including multiple substantially parallel channels extending from the second cover downward along a second space between the battery cells, to the drain holes, wherein the second water discharge pathway directs water infiltrating the battery pack to the drain holes.

18. The battery pack of claim 17, wherein at least a portion of the second cover extends along the top surface of the printed circuit board and an overhang portion projects downward along another side surface of the printed circuit board.

19. The battery pack of claim 17 wherein the first and second covers are supported by an internal frame that receives and secures the battery cells relative to the inner cavity of the housing.

* * * * *